United States Patent
Lee et al.

(10) Patent No.: US 10,269,579 B1
(45) Date of Patent: Apr. 23, 2019

(54) METHOD OF MANUFACTURING SEMICONDUCTOR DEVICE

(71) Applicant: TAIWAN SEMICONDUCTOR MANUFACTURING CO., LTD., Hsinchu (TW)

(72) Inventors: Shen-Nan Lee, Hsinchu County (TW); Teng-Chun Tsai, Hsinchu (TW); Chung-Wei Hsu, Hsinchu County (TW); Chen-Hao Wu, Keelung (TW); Tsung-Ling Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/907,030

(22) Filed: Feb. 27, 2018

Related U.S. Application Data

(60) Provisional application No. 62/593,144, filed on Nov. 30, 2017.

(51) Int. Cl.
| | |
|---|---|
| *H01L 21/302* | (2006.01) |
| *H01L 21/321* | (2006.01) |
| *C09G 1/02* | (2006.01) |
| H01L 21/306 | (2006.01) |
| H01L 21/768 | (2006.01) |

(52) U.S. Cl.
CPC ........... *H01L 21/3212* (2013.01); *C09G 1/02* (2013.01); *H01L 21/30625* (2013.01); *H01L 21/76829* (2013.01)

(58) Field of Classification Search
CPC ........ C09K 13/08; C09K 13/02; C09K 13/00; H01L 21/30604; H01L 21/76829; H01L 21/76802; H01L 21/30625; H01L 21/3212
USPC ..... 252/79.1, 79.2, 79.3; 438/692, 693, 745, 438/750, 435, 682
See application file for complete search history.

(56) References Cited

U.S. PATENT DOCUMENTS

| | | | |
|---|---|---|---|
| 9,899,521 B2 * | 2/2018 | Wang | H01L 29/0653 |
| 2006/0249482 A1 * | 11/2006 | Wrschka | C09G 1/02 216/88 |
| 2018/0005876 A1 * | 1/2018 | Tung | H01L 21/76802 |

* cited by examiner

*Primary Examiner* — Lan Vinh
(74) *Attorney, Agent, or Firm* — Maschoff Brennan

(57) ABSTRACT

A method of manufacturing a semiconductor device includes providing a substrate including a silicon oxide layer and a metal oxide layer covering the silicon oxide layer. A CMP slurry is prepared. The CMP slurry includes plural abrasive particles bearing negative charges, a Lewis base including a $(X_aY_b)^-$ group, and a buffer solution. The X represents a IIIA group element or an early transitional metal, and Y represents a pnictogen element, a chalcogen element or a halogen element. The CMP slurry has a pH in a range substantially from 2 to 7. Next, a planarization operation is performed on a surface of the metal oxide layer until a surface of the silicon oxide layer exposed. The planarization operation has a high polishing selectivity of the metal oxide layer with respect to the silicon oxide layer.

20 Claims, 17 Drawing Sheets

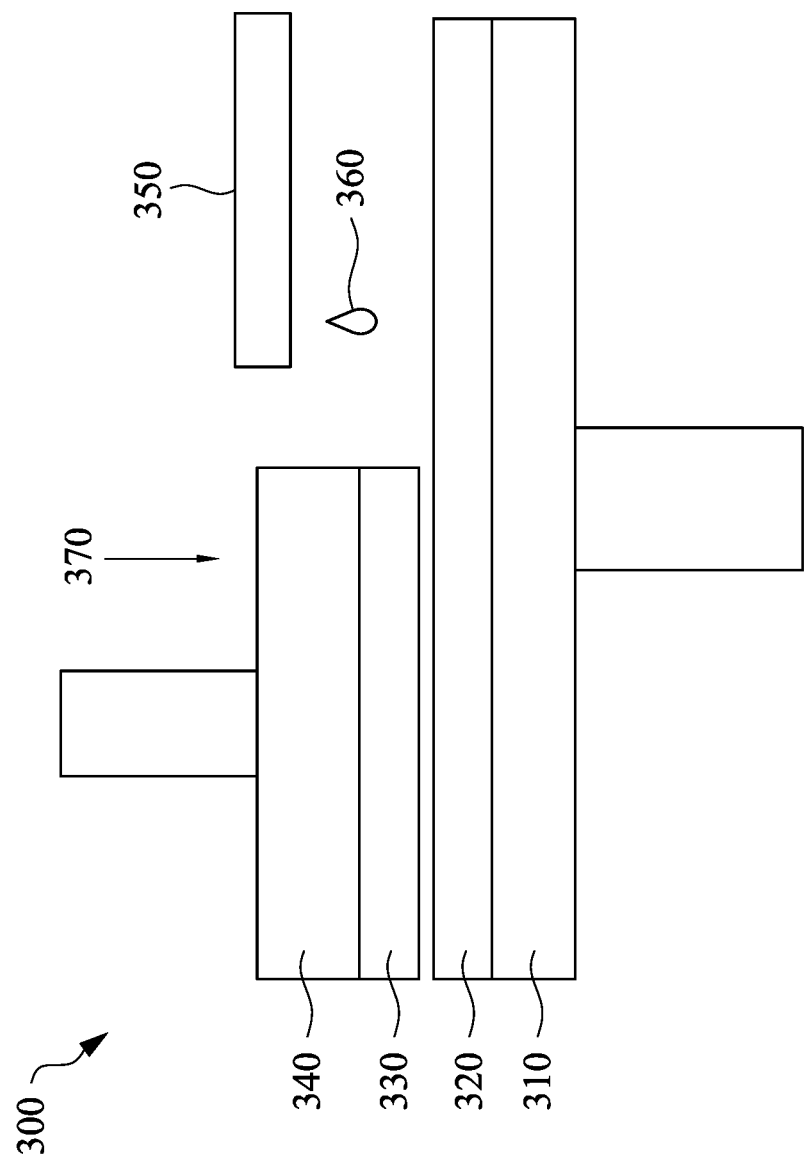

METHOD OF MANUFACTURING
SEMICONDUCTOR DEVICE

PRIORITY CLAIM AND CROSS-REFERENCE

This application claims the benefit of the Provisional Application Ser. No. 62/593,144, filed on Nov. 30, 2017. The entire disclosures of all the above applications are hereby incorporated by reference herein.

BACKGROUND

Integrated circuits may be formed using various photolithographic techniques. Such techniques typically include use of a chemical mechanical planarization (CMP) process. The CMP process is typically used to grind down and smooth the surface of a semiconductor substrate. In some cases, the CMP process is used to remove some or all of previously formed layer(s) that are no longer needed (i.e. a target layer). The CMP process uses a slurry solution that includes chemicals and solid particles to mechanically and chemically remove the target layer.

The target layer may be, for example, an etch stop hard mask used in a contact hole forming process. With the advance of the technology node and requirements for forming the contact hole with a high aspect ratio, a novel etch stop hard mask including a metal oxide is usually applied. However, it is difficult to remove the etch stop hard mask by the conventional CMP process. Accordingly, a CMP slurry and a method for performing a CMP process using the CMP slurry are required to tackle the problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a diagram showing an illustrative CMP system in accordance with some embodiments of the present disclosure.

DETAILED DESCRIPTION

Figure 1:
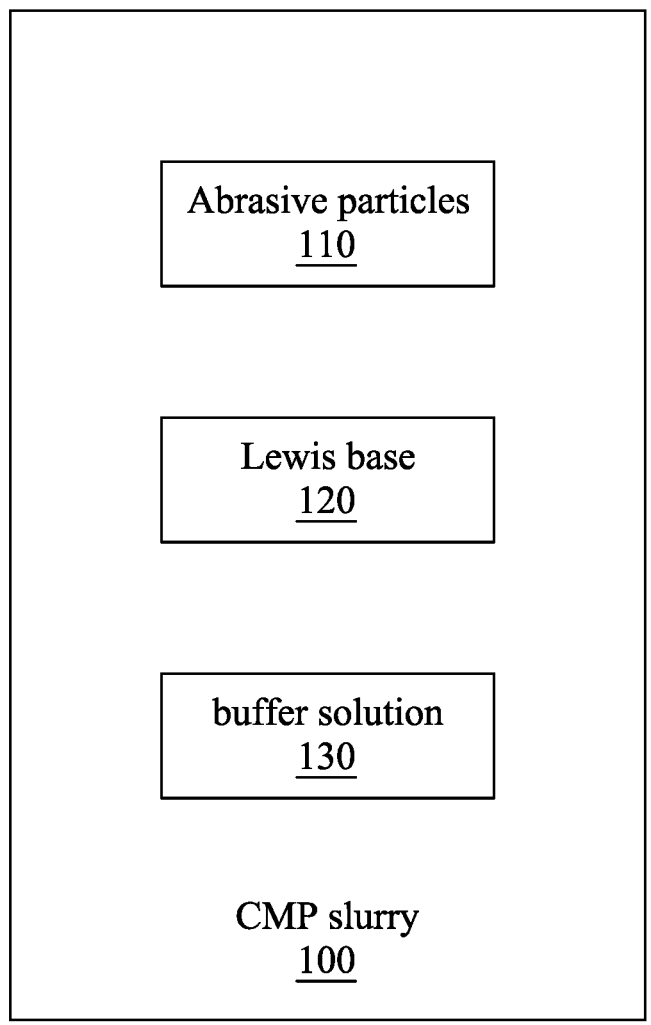
FIG. 1 is a diagram showing illustrative components of a CMP slurry of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A contact hole forming process may be performed to define a location of a contact feature of a semiconductor structure, in which the contact hole forming process include an etching operation. In some embodiments, the contact hole forming process is performed on an inter-layer dielectric (ILD) layer disposed between two gate structures. In order to prevent etching damages (i.e. a structure loss) of the gate structures during the contact hole forming process, a etch stop hard mask is formed on the gate structure before the contact hole formation process, and an excess material of the etch stop hard mask may be removed by chemical mechanical planarization (CMP) process. Then, the contact hole is formed by etching the ILD layer using the etch stop hard mask, followed by filling a conductive material in the formed contact hole.

With the advance of the technology node and requirements for forming the contact hole with a high aspect ratio, a novel etch stop hard mask formed from metal oxide may be used, instead of a conventional etch stop hard mask including a silicon nitride layer and a silicon cap layer. When forming the etch stop hard mask of the metal oxide, excess metal oxide has to be removed by the CMP process to expose a surface of the ILD layer for the subsequent contact hole formation process. However, the metal oxide of the novel etch stop hard mask is an inert material for an existing CMP process, causing a low removing rate (e.g. <100 Å/min) issue. To increase the removing rate, a higher downward force is required to remove the excess metal oxide, while a low selectivity of the metal oxide with respect to silicon oxide (i.e. the ILD layer adjacent to the etch stop hard mask) becomes a severe issue. The higher downward force may cause a scratch damage to the ILD layer, within die (WiD) loss, within wafer (WiW) loss and/or a CMP dishing effect. Furthermore, a debris of the removed metal oxide is easily to agglomerate, leading to another risk of the scratch damages on the ILD layer. Besides, a slurry of the existing CMP process has a short pot life due to an oxidizer included in the slurry.

Embodiments of the present disclosure are directed to providing a CMP slurry and a method for manufacturing a semiconductor device. The CMP slurry may include plural abrasive particles, a Lewis base and a buffer solution. The method mainly includes a CMP process using the CMP slurry to remove a portion of the metal oxide layer in a low downward force, so as to prevent damages to the ILD layer.

Hereinafter, preparation of the CMP slurry 100 is described. Please refer to FIG. 1. FIG. 1 is a diagram showing illustrative components of the CMP slurry 100. As shown in FIG. 1, the CMP slurry 100 includes plural abrasive particles 110, a Lewis base 120 and a buffer solution 130 in some embodiments. The CMP slurry 100 has a pH in a range substantially from 2-7 (hereinafter as "a slurry pH"). The components are introduced sequentially as follows. In other embodiments, the CMP slurry 100 may include other component as well.

Figure 2A:
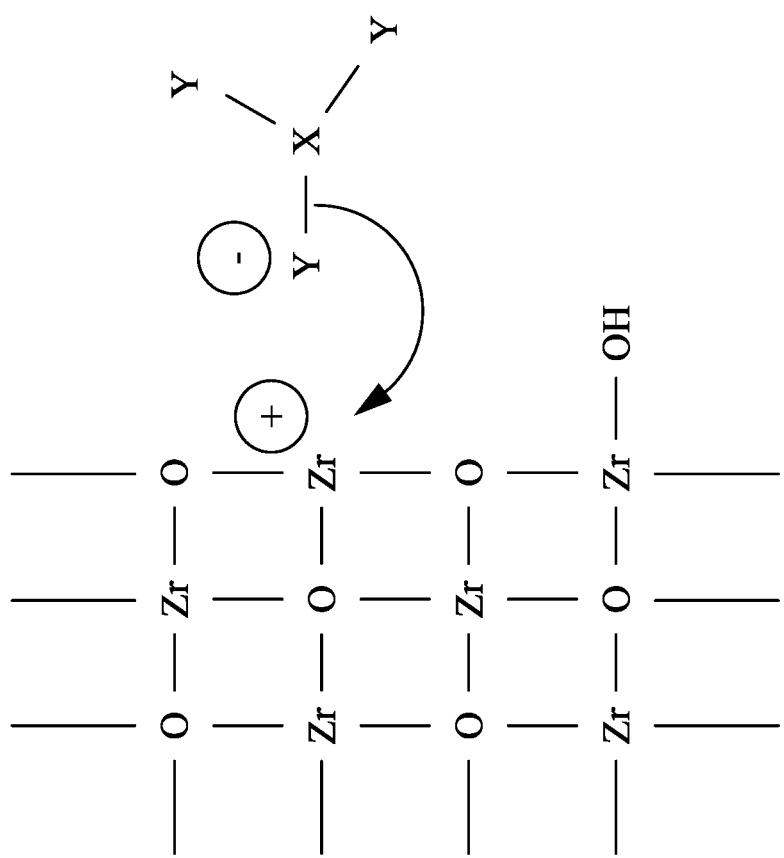
FIG. 2A and FIG. 2B are schematic views of a micro structure of a metal oxide layer reacting with a Lewis base of a CMP slurry in accordance with some embodiments of the present disclosure.

The abrasive particles 110 in the CMP slurry 100 bear negative charges at the pH in a range substantially from 2-7, such that the abrasive particles 110 may be attracted by the positively charged metal oxide layer (e.g. zirconium oxide shown in FIG. 2A). Therefore, collision probability between the abrasive particles 110 and the metal oxide layer increases, and the efficiency of the CMP process is improved. In some embodiments, the abrasive particles 110 include silicon dioxide ($SiO_2$), which bear negative charges (i.e. has a negative zeta potential) at the slurry pH according to the aqueous isoelectric point of silicon dioxide. In some embodiments, silicon dioxide may include silica colloid, silica thin film, or any other suitable silica. Furthermore, silicon dioxide may be modified (e.g. surface modification) or unmodified in other embodiments. However, the surface modification does not change the charge state on a surface of each of the abrasive particles at the slurry pH. Moreover, silicon oxide is a relatively softer particle, and may prevent the scratch damage to the ILD layer.

In some embodiments, the abrasive particles 110 further include cerium oxide ($CeO_2$), titanium oxide ($TiO_2$), aluminum oxide ($Al_2O_3$), zirconium oxide ($ZrO_2$) or a combination thereof. Surfaces of $CeO_2$, $TiO_2$, $Al_2O_3$, and $ZrO_2$ may be modified to bear the negative charges in the CMP slurry 100 with the slurry pH, though $CeO_2$, $TiO_2$, $Al_2O_3$, and $ZrO_2$ have positive zeta potentials at the slurry pH. The surface modification may be performed by coating $CeO_2$, $TiO_2$, $Al_2O_3$, and $ZrO_2$ with a material (e.g. silicon dioxide) that bears negative charges at the slurry pH. The method of the modification may be known by one of the skilled in the art, and may not be further described herein.

A particle size of the abrasive particles 110 may be chosen depends on requirements of different CMP process, the material to be removed, and the like. A greater particle size may result in a greater removing rate while more likely for the ILD layer being scratched. On the other hand, the abrasive particles 110 with a smaller particle size reduce the risk of the scratch damage while the removing rate is slow.

In some embodiments, based on 100 weight percent (wt. %) of the CMP slurry 100, the abrasive particles 110 are present in an amount of substantially from 0.1 wt. % to 4 wt. %. When the amount of the abrasive particles 110 is less than 0.1 wt. %, the removing rate of the CMP process applying the CMP slurry may be slow, and the efficiency of the CMP process is poor. When the amount of the abrasive particles 110 is greater than 4 wt. %, the selectivity of the metal oxide layer with respect to the ILD layer becomes poor.

Still referring to FIG. 1, the CMP slurry 100 includes the Lewis base 120. In some embodiments, the Lewis base 120 includes a $(X_aY_b)^-$ group, where X represents a IIIA group element or an early transitional metal, Y represents a pnictogen element, a chalcogen element or a halogen element, and a>0 and b>0. In some embodiments, in the $(X_aY_b)^-$ group, a ratio of a to b is in a range substantially from 0.25 to 0.5. When the ratio is not within the range substantially from 0.25 to 0.5, the efficiency of the CMP process cannot be improved. In a certain embodiment, a ratio of a to b is substantially in a range from 0.25 to 0.4.

In some embodiments, the Lewis base 120 may have a chemical formula shown in formula (I):

$$M(X_aY_b) \qquad (I)$$

where M represents a singly charged cation. In some embodiments, in the formula (I), M may include $NH_4^+$, $K^+$, $Na^+$ or $H^+$. However, other singly charged cations may be used in other embodiments. For example, the Lewis base 120 may include $NH_4BF_3$, $HBF_4$, $HBF_3$, $NaBF_3$, $KBCl_3$, $NH_4BCl_3$ or a combination thereof. However, the examples of the Lewis base disclosed herein are not intended to limit the scope of the present disclosure, any Lewis base that satisfies the chemical formula (I) may be used.

Figure 2B:
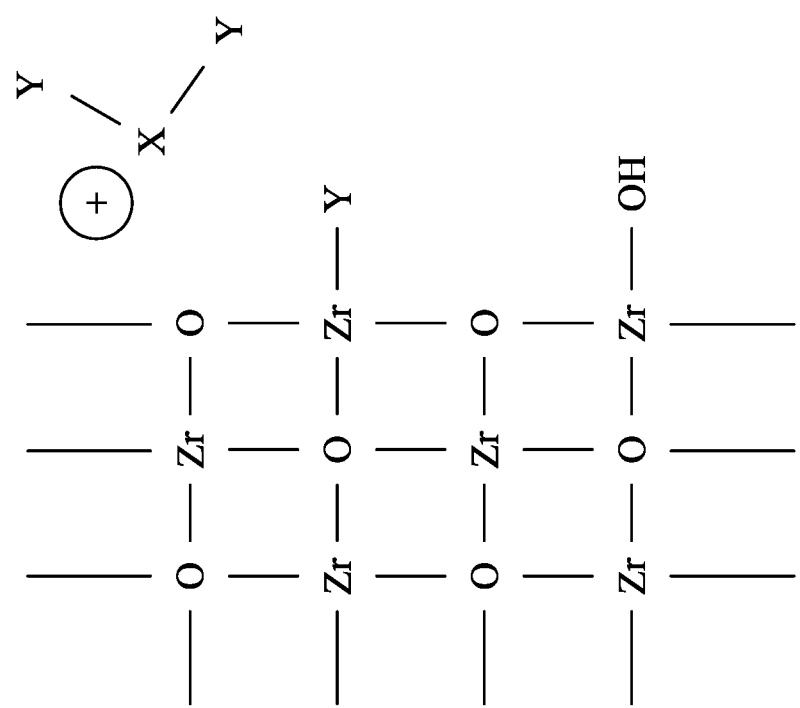

Referring to FIG. 2A and FIG. 2B, FIG. 2A and FIG. 2B are schematic views of a micro structure of a metal oxide layer reacting with a Lewis base of a CMP slurry in accordance with some embodiments of the present disclosure. The $(X_aY_b)^-$ group of the Lewis base 120 can react with the metal oxide layer, such as zirconium oxide shown in FIG. 2A, thereby forming soluble mixed complexes (e.g. $Zr(ZrO_nY_m)$ as shown in FIG. 2B). The soluble mixed complexes are relatively easier to be removed and more hydrophilic, such that the soluble mixed complexes can be well-dispersed in water without agglomeration. Therefore, removal of the excess metal oxide layer by the CMP slurry 100 is efficient and less harmful to the ILD layer. Besides, the reaction occurs merely between the metal oxide layer and the Lewis base, and thus a sufficient selectivity of the metal oxide layer with respect to the ILD layer during the CMP process may be provided. FIG. 2A and FIG. 2B are made with zirconium oxide as the metal oxide layer, however, other metal oxides for the ILD layer disclosed in the present disclosure may also be used.

In some embodiments, based on 100 weight percent (wt. %) of the CMP slurry 100, the Lewis base 120 is present in an amount of substantially from 0.01 wt. % to 1 wt. %. When the amount of the Lewis base 120 is less than 0.01 wt. %, the efficiency of the CMP process may be reduced. When the amount of the Lewis base 120 is greater than 1 wt. %, the selectivity of the metal oxide layer with respect to the ILD layer is insufficient.

Still referring to FIG. 1, the CMP slurry 100 includes the buffer solution 130. In some embodiments, the buffer solution 130 may include phosphoric acid, ammonium hydroxide, an organic acid or a combination thereof. In some embodiments, the organic acid includes oxalic acid or citric acid. Basically, the buffer solution keeps the CMP slurry 100 at the slurry pH (e.g. pH 2 to pH 7). In other words, when the CMP slurry 100 is not at the slurry pH, the buffer solution 130 may be used to adjust the pH. Furthermore, a degree of dissociation of the Lewis base 120 is improved at the slurry pH, thereby providing a better performance of the CMP process.

The CMP slurry 100 may further include a wetting agent or a surfactant. The wetting agent is a compound that has a molecular structure with both a hydrophobic end and a hydrophilic end. Accordingly, such material is able to reduce the surface tension of the CMP slurry 100 and provide better contact between a polishing head and the material to be removed or planarized (e.g. the etch stop hard mask).

In some embodiments, an oxidizer is excluded from the CMP slurry 100 of the present disclosure. The oxidizer may be, for example, $H_2O_2$, HOCl, $Fe_2(NO_3)_3$, $KIO_3$, and the like. Due to the exclusion of the oxidizer, the CMP slurry of the present disclosure overcomes the issue of the activity decay of the oxidizer. Therefore, one of the advantages of the CMP slurry of the present disclosure is the longer pot life (e.g. longer than 2 weeks).

Referring to FIG. 3, FIG. 3 is a diagram showing an illustrative CMP system in accordance with some embodiments of the present disclosure. As shown in FIG. 3, the system 300 includes a platen 310, a polishing pad 320, a polishing head 340 and slurry delivery tool 350. The polishing pad 320 is disposed on a platen 310, a substrate 330 is secured to the polishing head 340, and the slurry solution delivery tool 350 is used to provide a CMP slurry 360.

The platen 310 is a flat structure to hold the polishing pad 320. In some embodiments, the platen 310 may be a circular shape when viewed from the top. Additionally, the platen 310 may be designed to rotate around a central axis. The polishing pad 320 is designed to be pressed directly to the surface of the substrate 330 to be planarized. The polishing pad 320 provides a flat surface and is made of a material designed for use with the CMP process.

The substrate 330 is typically secured upside down to the polishing head 340. In some embodiments, the substrate 330 may further include a metal oxide layer (not shown) thereon, in which the metal oxide layer contacts the polishing pad 320. In some embodiments, a vacuum system is used to secure the substrate 330 to the polishing head 340. For example, the polishing head 340 may be referred to as a chuck. The polishing head 340 may move across the surface of the polishing pad 320 to rub the substrate 330 against the polishing pad 320. In addition, the polishing head 340 provides a downward force 370 to the substrate 330 during the CMP process is performed.

The slurry delivery tool 350 delivers the CMP slurry 360 to the surface of the polishing pad 320, and thus the CMP slurry 360 can be applied to the surface of the substrate 330. In some embodiments, the CMP slurry 360 may be the CMP slurry 100 shown in FIG. 1.

Referring to FIG. 4A to FIG. 4F, FIG. 4A to FIG. 4F are cross-sectional views of intermediate stages showing a method for forming a contact structure of a semiconductor device in accordance with some embodiments of the present disclosure. The method includes a CMP process using the aforementioned CMP slurry. Besides, the CMP process is performed by using the system 300 shown in FIG. 3, while the elements such as the polishing pad, the platen, the polishing head and the slurry delivery tool of the system 300 are omitted to simplify the figures. Furthermore, the metal oxide layer on the substrate is practically planarized with an upside down position while the substrate and the metal oxide layer in FIG. 4A to FIG. 4F are shown in a right-side-up position for convenience of description.

Figure 4A:
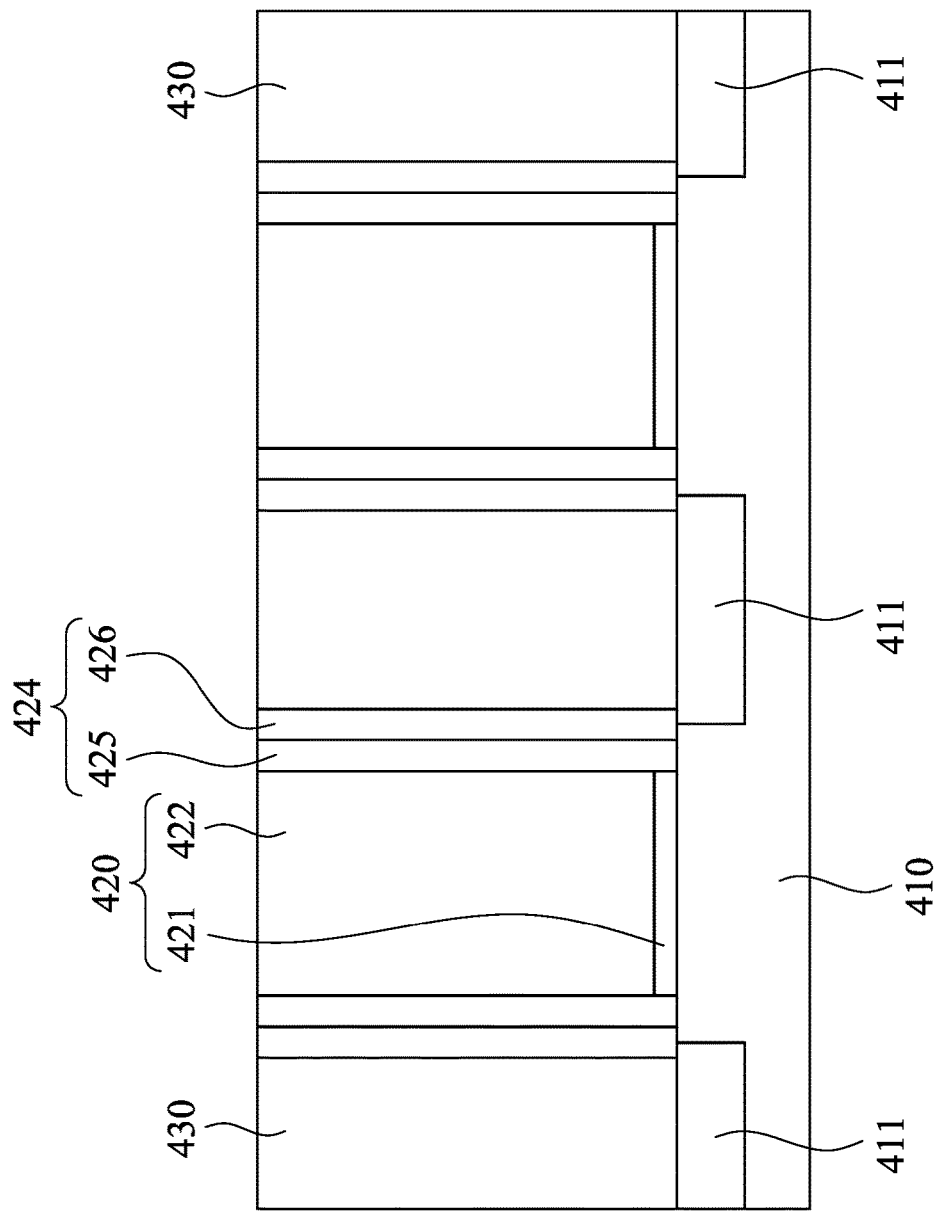
FIG. 4A to FIG. 4F are cross-sectional views of intermediate stages showing a method for forming a contact structure of a semiconductor device in accordance with some embodiments of the present disclosure.

As shown in FIG. 4A, a substrate 410 is provided. The substrate 410 is bulk silicon, but other commonly used materials and structures such as silicon on insulator (SOI) or a silicon layer overlying a bulk silicon germanium may also be used. Two dummy gate stacks 420 are formed on the substrate 410, and a spacer structure 424 is formed on a sidewall of each of the dummy gate stacks 420. Each of the dummy gate stacks 420 includes an interfacial layer 421 and a dummy gate layer 422 on the interfacial layer 421. In some embodiments, the dummy gate layer 422 may be formed by polysilicon. In some embodiments, the interfacial layer 421 includes silicon oxide, silicon nitride or silicon oxynitride. Formation of each of the dummy stacks 420 includes sequentially depositing an interfacial layer 421 and a dummy gate layer 422, followed by patterning the interfacial layer 421 and the dummy gate layer 422 using a mask layer (not shown). Then, the spacer structure 424 is formed on the sidewall of each of the dummy gate stacks 420 after the formation of the dummy gate stacks 420. In some embodiments, the spacer structure 424 includes an oxide spacer layer 425 and a nitride spacer layer 426. For example, the oxide spacer layer 425 is formed from silicon oxide, and the nitride spacer layer 426 is formed from silicon nitride. In some embodiments, the spacer structure 424 is formed by depositing the oxide spacer layer 425 on the sidewall of each of the dummy gate stacks 420, and then depositing the nitride spacer layer 426 on the oxide spacer layer 425 and over the sidewall of each of the dummy gate stacks 420.

Next, still referring to FIG. 4A, an inter-layer dielectric (ILD) layer 430 is formed on the substrate 410, the dummy gate stacks 420 and the spacer structure 424. In some embodiments, a typical CMP process is performed to remove a portion of the ILD layer 430 and expose top surfaces of the dummy gate stacks 420 and the spacer structure 424. In some embodiments, the ILD layer 430 is formed by a thermal oxidation process or a flowable chemical vapor deposition (FCVD) process. In some embodiments, the ILD layer 430 may be a silicon oxide layer including silicate glass (USG), an alkoxysilane compound, thermal oxide, FCVD oxide or a combination thereof. For example, the alkoxysilane compound may be tetraethoxysilane (TEOS), tetramethoxysilane (TMOS), or the like. In some embodiments, a doped region 411 may be formed in the substrate 410 by an implantation process.

Figure 4B:
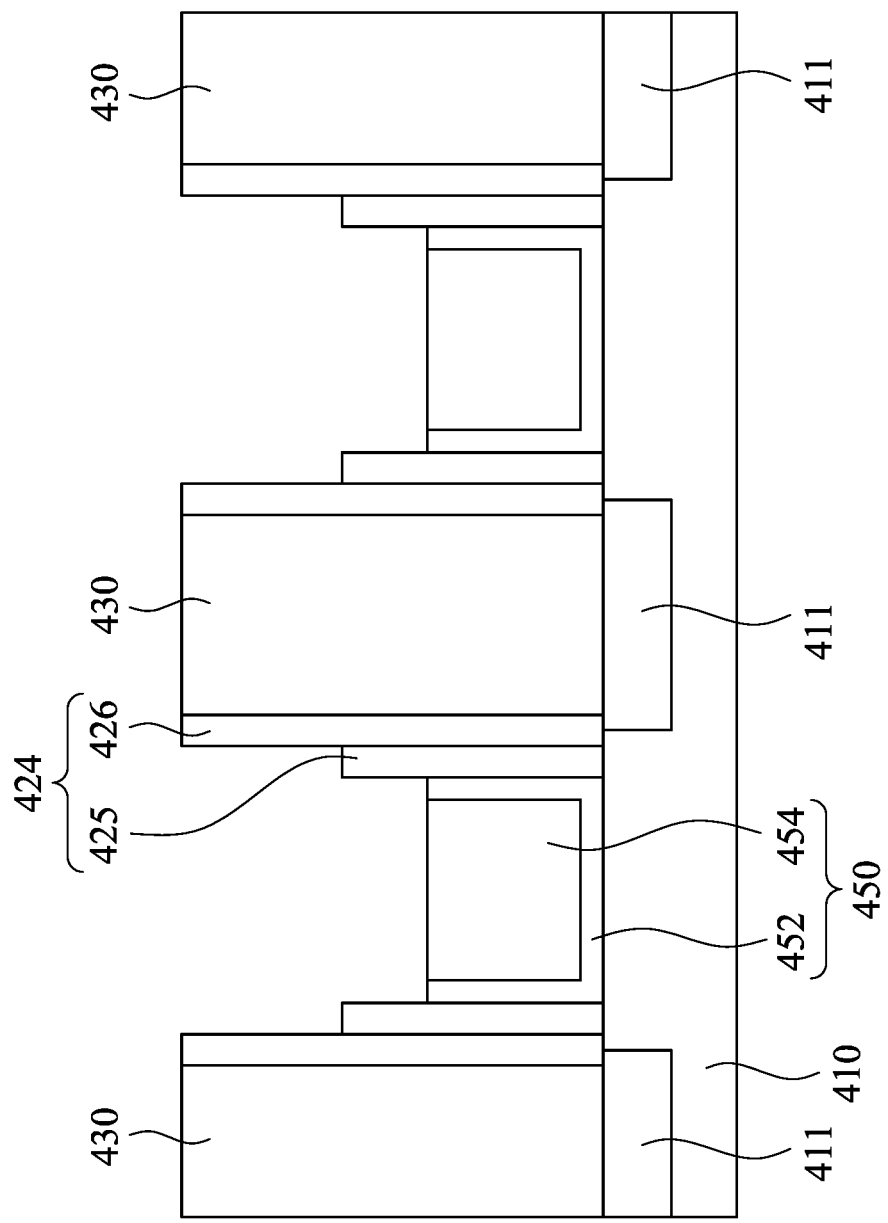

Referring to FIG. 4B, the dummy gate stacks 420 are removed, thereby forming trenches 440 in the ILD layer 430. In some embodiments, a portion of the oxide spacer layer 425 may be removed, such that the top surface of the oxide spacer layer 425 is lower than the top surface of the nitride spacer layer 426. Then, a gate structure 450 is formed in each of the trenches 440. A gate dielectric layer 452 is deposited first on a bottom and at least a portion of a sidewall of each of the trenches 440. Next, a metal gate layer 454 is formed on the gate dielectric layer 452 in each of the trenches 440. The gate structure 450 are merely formed in a portion of each of the trenches 440, such that top surfaces of the gate dielectric layer 452 and the metal gate layer 454 are lower than the top surface of the ILD layer 430. In some embodiments, the gate dielectric layer 452 may formed by a high-k (dielectric constant) material including hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The gate dielectric layer 452 is formed by a deposition process, such as an ALD process, a CVD process, a PVD process or a sputter deposition process. In some embodiments, the metal gate layer 454 may include a metal, such as Al, W, Co, or Cu, and may be formed by ALD, PVD, CVD, or other processes. In a further embodiment, plural work function metal layers (not shown) are formed between the gate dielectric layer 452 and the metal gate layer 454.

Figure 4C:
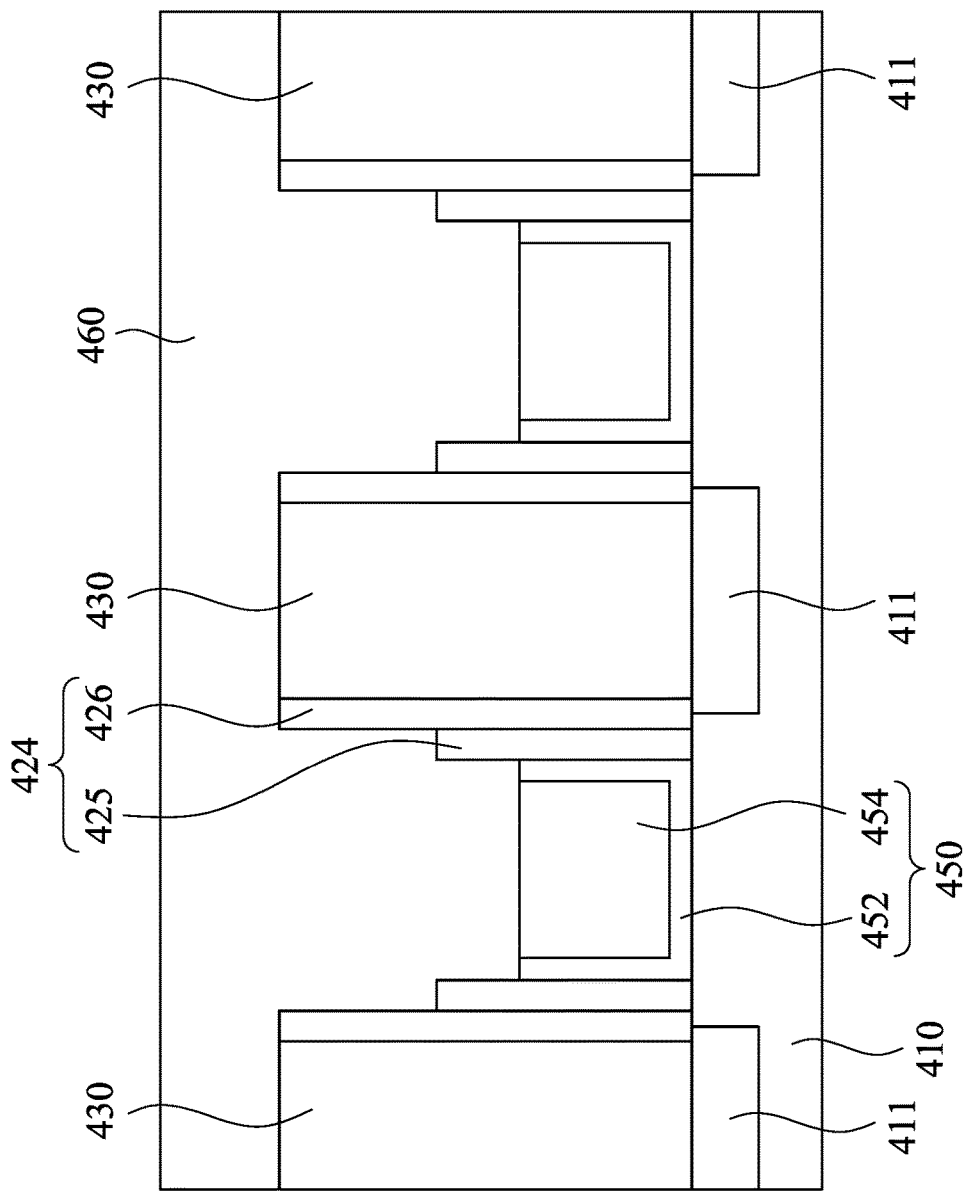

Referring to FIG. 4C, a metal oxide layer 460 is deposited on the gate structure 450 and the spacer structure 424 in each of the trenches 440 and on the ILD layer 430. In some embodiments, the metal oxide layer includes $HfO_2$, $ZrO_2$ or $Y_2O_3$. In some embodiments, the metal oxide layer 460 may be formed by a deposition process. For example, an atomic layer deposition (ALD) process, LPCVD (low-pressure chemical vapor deposition), PCVD (atmospheric-pressure chemical vapor deposition), PECVD (plasma-enhanced chemical vapor deposition), PVD (physical vapor deposition), sputtering, and future-developed deposition process may be used. In a certain example, the metal oxide layer 460 is formed from $ZrO_2$ by ALD.

Then, a CMP slurry similar to the CMP slurry 100 of FIG. 1 is prepared. In a certain example, the CMP slurry includes $SiO_2$ particles as the abrasive particles and $NaBF_3$ as the Lewis base at pH 4-6. In another certain example, the CMP slurry includes $SiO_2$ particles as the abrasive particles and $KBF_3$ as the Lewis base at pH 4-6. In a further certain example, the CMP slurry includes $SiO_2$ particles as the abrasive particles and $HBF_4$ as the Lewis base at pH 3.

Figure 4D:
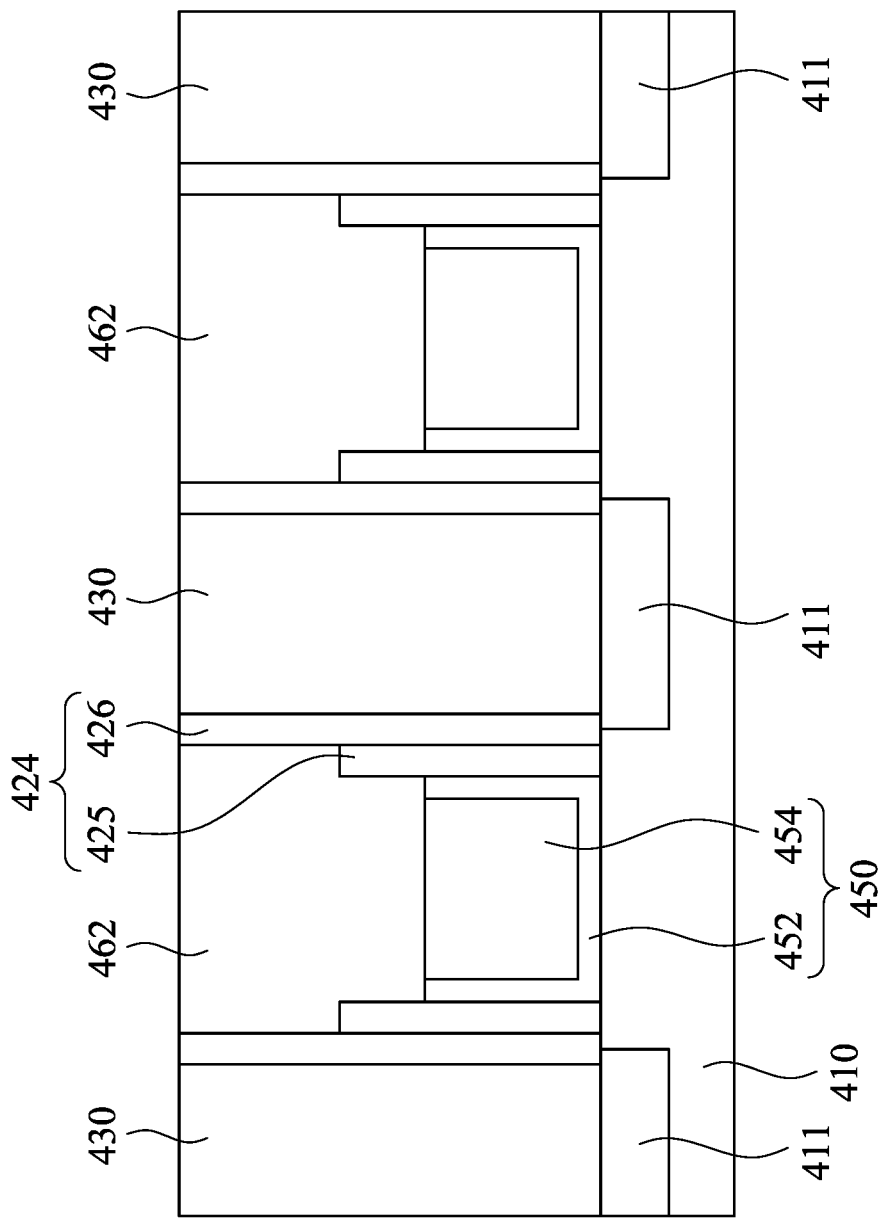

Referring to FIG. 4D, a planarization operation is performed on a surface of the metal oxide layer 460 with a polishing head 340 and the CMP slurry injected on the surface of the metal oxide layer 460 until the surface of the ILD layer 430 exposed, such that a portion of the metal oxide layer 460 is removed and the other portion of the metal oxide layer 460 is used as an etch stop hard mask 462. The polishing head 340 may apply a downward force onto the surface of the metal oxide layer 460 during the CMP process. In some embodiments, the downward force is substantially in a range from 0.5 psi to 3 psi. In some embodiments, the downward force is in a range substantially from 0.5 psi to 1 psi. When the downward force is smaller than 0.5 psi, the removing rate for removing the metal oxide layer 460 is too slow. On the other hand, when the downward force is greater than 3 psi, the selectivity of the metal oxide layer 460 with respect to the ILD layer 430 is insufficient, such that the ILD layer 430 is damaged when the ILD layer 430 is exposed.

In practical, the CMP slurry is delivered to the polishing pad 320 (shown in FIG. 3) during the CMP process, and then the CMP slurry can be applied onto the surface of the metal oxide layer 460. In some embodiments, the CMP slurry may be applied at a flowrate in a range substantially from 100 ml per minute to 500 ml per minute for an acceptable removing rate to remove the metal oxide layer 460. As described in FIG. 1, FIG. 2A and FIG. 2B, the metal oxide layer 460 may react with the Lewis base in the CMP slurry to form the soluble complexes and the pH of the CMP slurry increases the collision between the abrasive particles and the metal oxide layer 460. Therefore, the metal oxide layer 460 may be removed easily during CMP process. In some embodiments, the planarization operation has a high selectivity to the metal oxide layer 460 with respect to the ILD layer 430, and the selectivity is substantially greater than 15. Furthermore, a repulsive force is generated between the abrasive particles and the ILD layer 430 when the ILD layer 430 is exposed during the planarization operation. The repulsive force can further protect the ILD layer 430 from being damaged during the CMP process. In the certain embodiments, within die (WiD) loss of the semiconductor device may be less than 5 nm, and the CMP dishing of the semiconductor device may be less than 1 nm after the CMP process is performed.

Figure 4E:
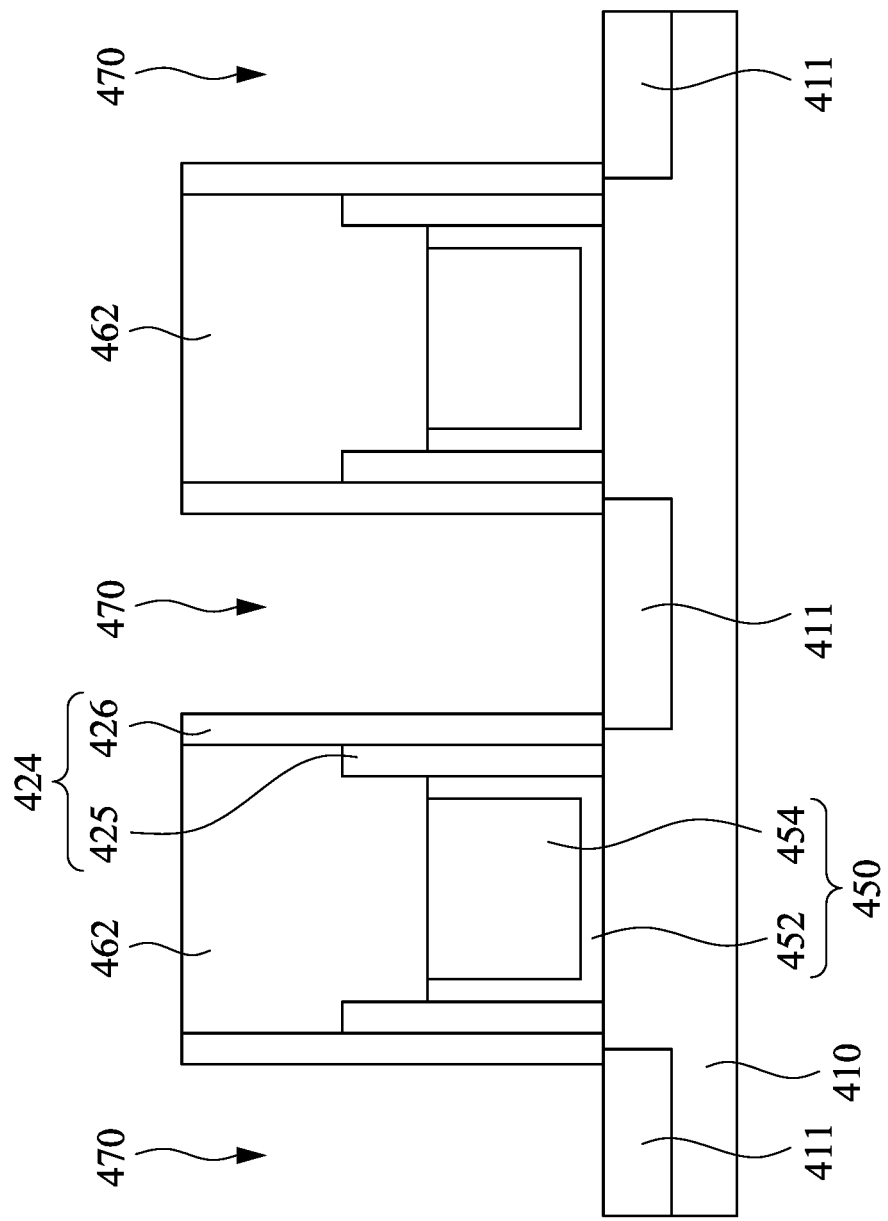
Figure 4F:
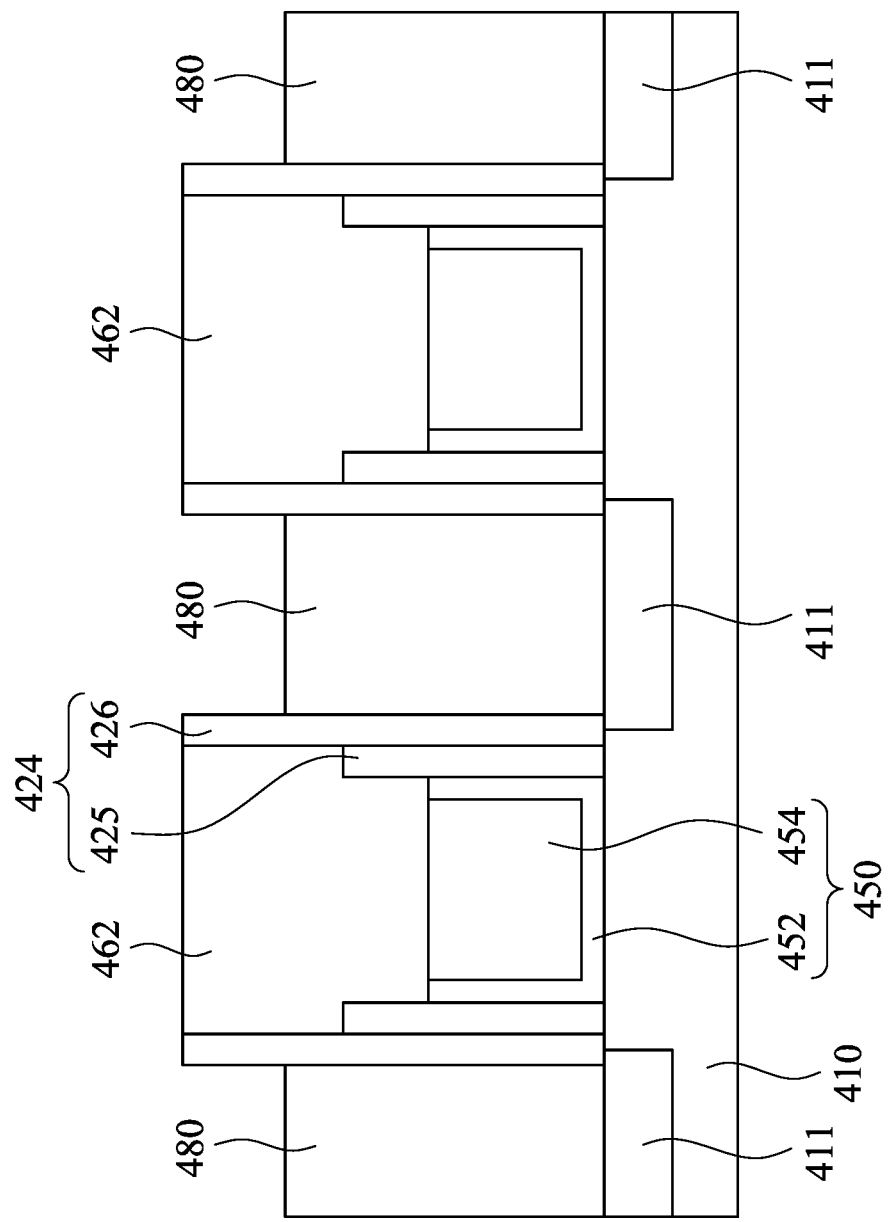

Then, as shown in FIG. 4E, the ILD layer 430 is etched using the etch stop hard mask 462 to protect the underlying spacer structure (the oxide spacer layer 425) and the gate structure 450, and contact holes 470 are formed between the gate structures 450. In some embodiment, each of the contact holes 470 has a high aspect ratio (e.g. greater than 7). Next, as shown in FIG. 4F, the contact holes 470 are filled with a conductive material 480. In some embodiments, the conductive material may include metal, such as tungsten, tungsten-based alloy, copper, copper-based alloy, gold, gold alloy, silver, silver alloy, and the like. In some embodiments, the conductive material 480 may form a contact structure.

Figure 5:
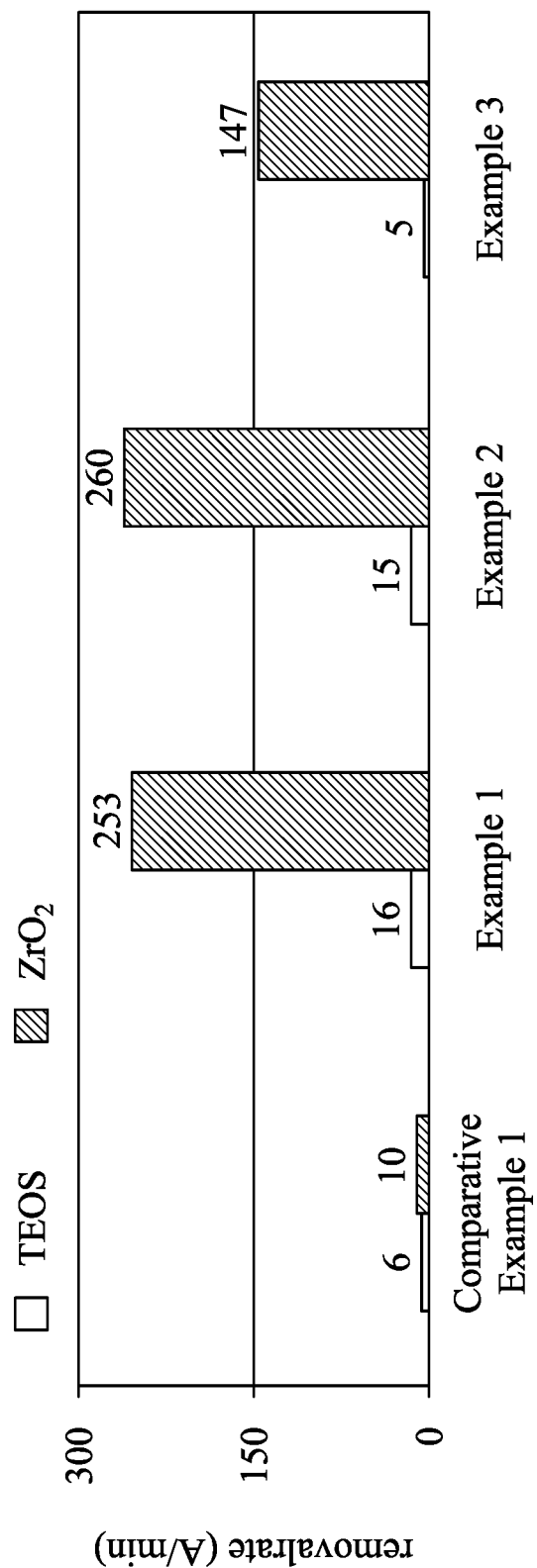
FIG. 5 is a bar chart showing selectivity of $ZrO_2$ with respect to TEOS when different CMP slurries are applied in CMP processes.

Please refer to FIG. 5. FIG. 5 is a bar chart showing selectivity of $ZrO_2$ with respect to TEOS when different CMP slurries are applied in CMP processes. Examples 1-3 and Comparative example 1 of FIG. 5 are performed by the process similar to FIG. 4A to FIG. 4F, in which the ILD layer 430 is made of TEOS and the metal oxide layer 460 is made of ALD $ZrO_2$. Detailed components of the CMP slurries of Examples 1-3 and Comparative example 1 are shown in the following Table 1.

TABLE 1

|  | Example | | | Comparative |
| --- | --- | --- | --- | --- |
|  | 1 | 2 | 3 | Example 1 |
| Lewis base | $NaBF_3$ | $NaBF_3$ | $KBF_3$ | — |
| pH | 3 | 5 | 3 | 5 |
| Abrasive particles | 1 wt. % $SiO_2$ | 1 wt. % $SiO_2$ | 1 wt. % $SiO_2$ | 1 wt. % $SiO_2$ |
| Downward force (psi) | 2 | 2 | 2 | 2 |

As shown in FIG. 5, the CMP process using the CMP slurries of Examples 1-3 provides high selectivity of $ZrO_2$ with respect to TEOS (e.g. a ratio of the removing rates of $ZrO_2$ and TEOS is higher than 15.8), in which the CMP slurries of Examples 1-3 include the Lewis base and the abrasive particles at the slurry pH. On the other hand, the CMP process using the CMP slurry of Comparative example 1 without the Lewis base fails to provide sufficient selectivity of $ZrO_2$ with respect to TEOS (e.g. the selectivity is merely 1.7). Furthermore, the removing rates of $ZrO_2$ in Examples 1-3 are much faster than the removing rate of $ZrO_2$ in Comparative example 1. Accordingly, the CMP slurry of the present disclosure improves both the selectivity and the removing rate of the CMP process.

Figure 6:
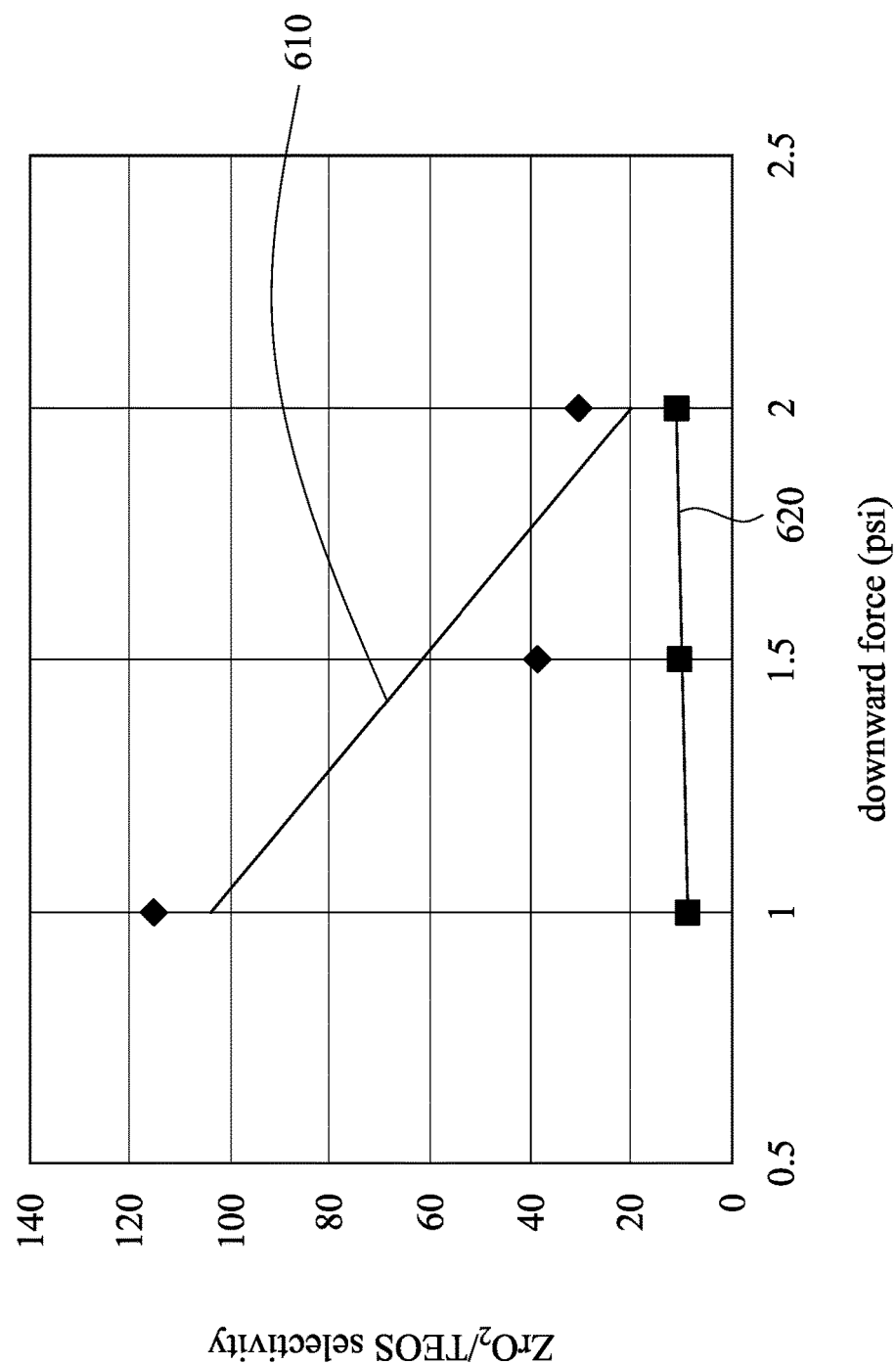
FIG. 6 is a scatter diagram showing selectivity of $ZrO_2$ with respect to TEOS varying with different downward forces during a CMP process using different CMP slurries.
Figure 7:
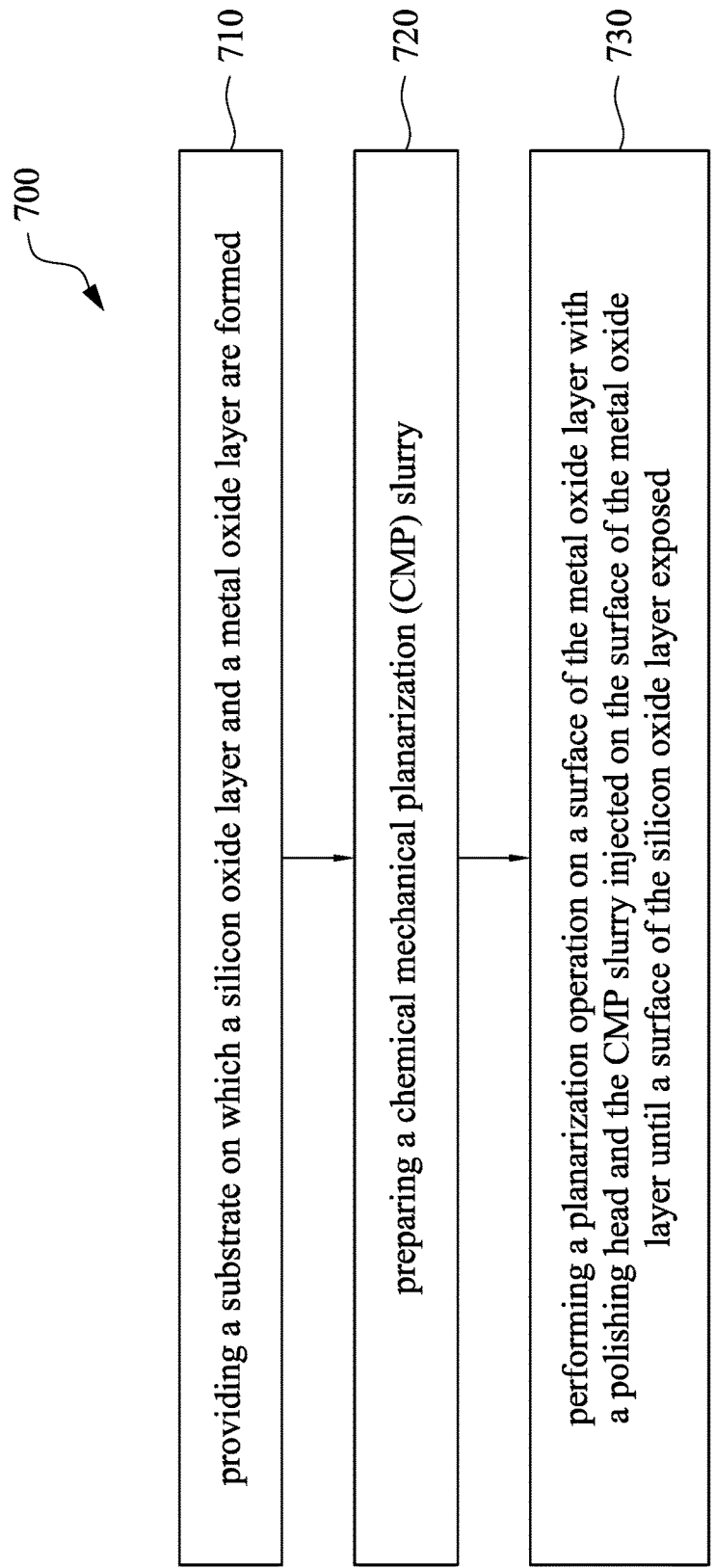
FIG. 7 is a flow chart showing a method for manufacturing a semiconductor device in accordance with some embodiments of the present disclosure.
Figure 8A:
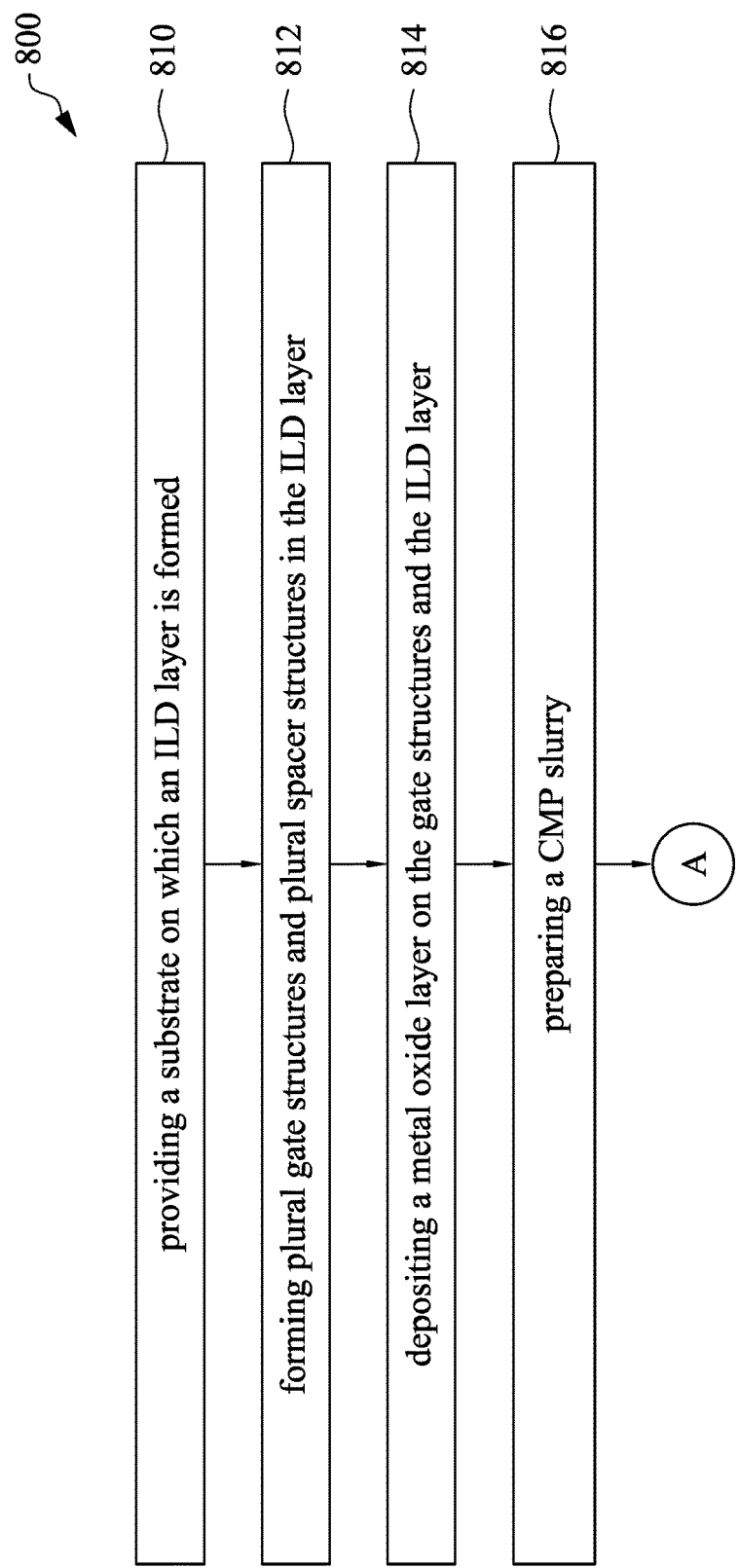
FIG. 8A and FIG. 8B are flow charts showing a method for manufacturing a semiconductor device in accordance with some embodiments of the present disclosure.
Figure 8B:
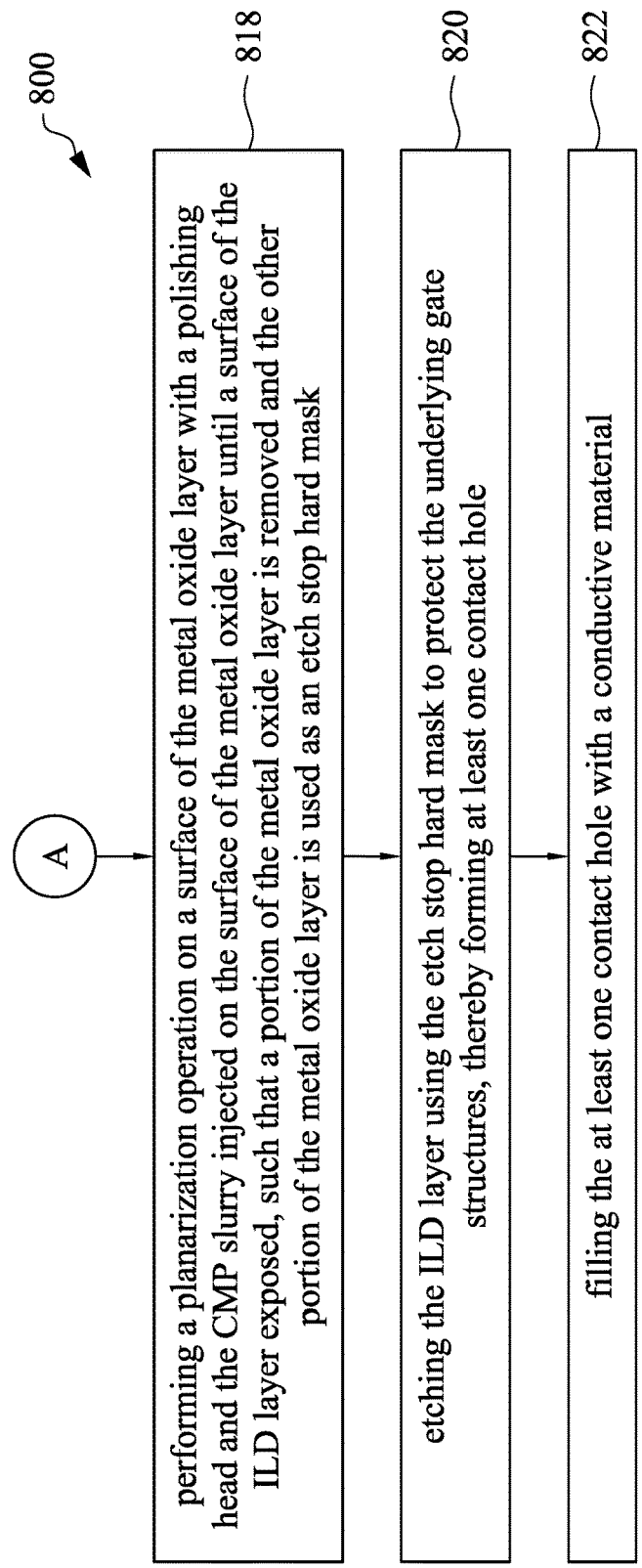
Figure 9A:
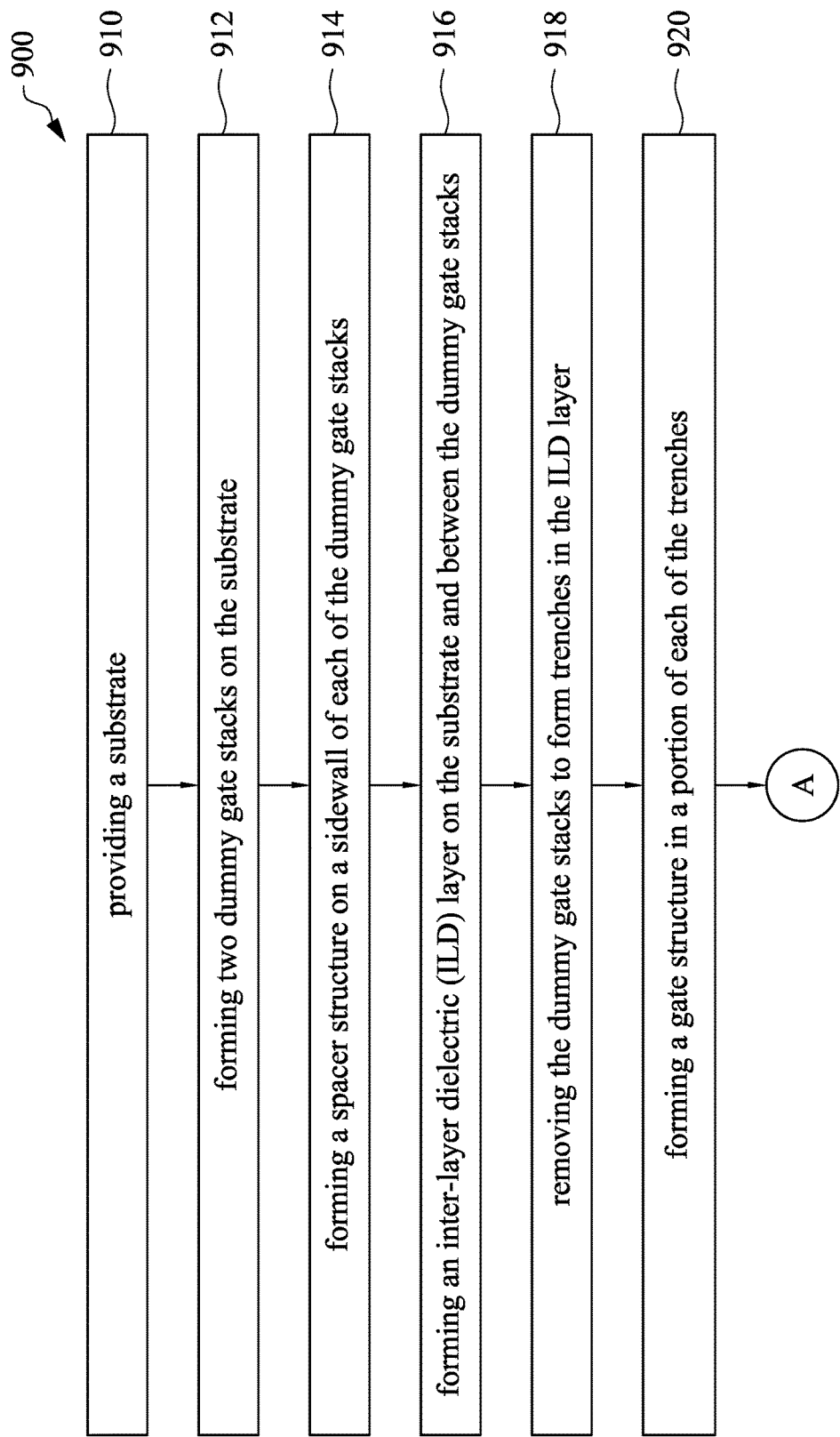
FIG. 9A and FIG. 9B are flow charts showing a method for manufacturing a semiconductor device in accordance with some embodiments of the present disclosure.
Figure 9B:
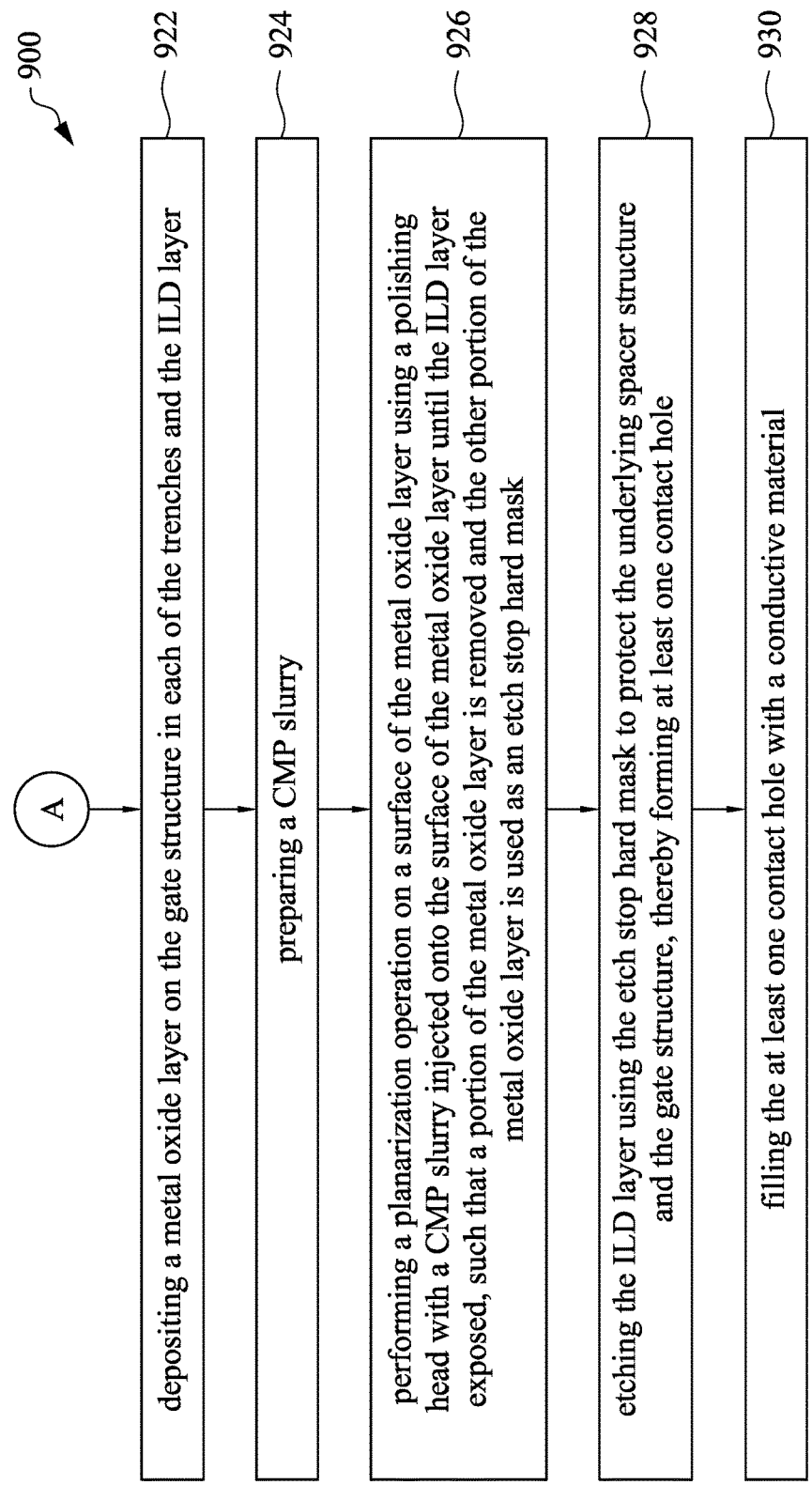

Referring to FIG. 6, FIG. 6 is a scatter diagram showing selectivity of $ZrO_2$ with respect to TEOS varying with different downward forces during a CMP process using different CMP slurries. A trend line 610 of Example 4 is obtained from a CMP process using a CMP slurry including $HBF_4$ as the Lewis base and 1 wt. % $SiO_2$ as the abrasive particles at pH 3; and, a trend line 620 of Comparative example 2 is obtained from a CMP process using a CMP slurry including 1 wt. % $SiO_2$ as the abrasive particles at pH 3, in which the CMP slurry of Comparative example 2 is lack of the Lewis base. As shown in FIG. 6, the CMP process using the CMP slurry of Example 4 has a higher selectivity of $ZrO_2$ with respect to TEOS, and the selectivity decreases with increase of the downward force. However, the CMP process using the CMP slurry of Comparative example 2 has insufficient selectivity whether the downward forces is low or high.

Referring to FIG. 4A to FIG. 4F and FIG. 7, FIG. 7 is a flow chart showing a method for manufacturing a semiconductor device in accordance with some embodiments of the present disclosure. At operation 710, a substrate 410 on which a silicon oxide layer (e.g. the ILD layer 430) and a metal oxide layer 460 are formed is provided, as shown in FIG. 4A to FIG. 4C. At operation 720, a CMP slurry is prepared. At operation 730, a planarization operation is performed on a surface of the metal oxide layer 460 with a polishing head and the CMP slurry injected on the surface of the metal oxide layer 460 until a surface of the silicon oxide layer 430 exposed, as shown in FIG. 4D. The method may further includes removing the ILD layer 460 to form contact holes 470, and filling the contact holes 470 with a conductive material 480, as shown in FIG. 4E and FIG. 4F.

Referring to FIG. 4A to FIG. 4F, FIG. 8A and FIG. 8B, FIG. 8A and FIG. 8B are flow charts showing a method for manufacturing a semiconductor device in accordance with some embodiments of the present disclosure. At operation 810, a substrate 410 on which an ILD layer 430 is formed is provided. At operation 812, plural gate structures 450 and plural spacer structures 424 are formed in the ILD layer 430, as shown in FIG. 4A and FIG. 4B. At operation 814, a metal oxide layer 460 is deposited on the gate structures 450, the spacer structure 424 and the ILD layer 430, as shown in FIG. 4C. At operation 816, a CMP slurry is prepared. At operation 818, a planarization operation is performed on a surface of the metal oxide layer 460 with a polishing head and the CMP slurry injected on the surface of the metal oxide layer 460 until a surface of the ILD layer 430 exposed, such that a portion of the metal oxide 460 is removed and the other portion of the metal oxide layer 460 is used as an etch stop hard mask 462, as shown in FIG. 4D. At operation 820, the ILD layer 430 is etched using the etch stop hard mask 462 to protect the underlying gate structures 450, thereby forming at least one contact hole 470, as shown in FIG. 4E. At operation 822, the at least one contact hole 470 is filled with a conductive material 480, as shown in FIG. 4F.

Referring to FIG. 4A, to FIG. 4F, FIG. 9A and FIG. 9B, FIG. 9A and FIG. 9B are flow charts showing a method for manufacturing a semiconductor device in accordance with some embodiments of the present disclosure. At operation 910, a substrate 410 is provided. At operation 912, two dummy gate stacks 420 are formed on the substrate 410. At operation 914, a spacer structure 424 is formed on a sidewall of each of the dummy gate stacks 420. At operation 916, an ILD layer 430 is formed on the substrate 410 and between the dummy gate stacks 420, as shown in FIG. 4A. At operation 918, the dummy gate stacks 420 are removed to form trenches 440 in the ILD layer 430. At operation 920, a gate structure 450 is formed in a portion of each of the trenches 440, as shown in FIG. 4B. At operation 922, a metal oxide layer 460 is deposited on the gate structure 450 in each of the trenches 440, the spacer structure 424 and the ILD layer 430. At operation 924, a CMP slurry is prepared. At operation 926, a planarization operation is performed on a surface of the metal oxide layer 460 with a polishing head and the CMP slurry injected on the surface of the metal oxide layer 460 until a surface of the ILD layer 430 exposed, such that a portion of the metal oxide layer 460 is removed and the other portion of the metal oxide layer 460 is used as an etch stop hard mask 462, as shown in FIG. 4D. At operation 928, the ILD layer 430 is etched using the etch stop hard mask 462 to protect the underlying gate structures 450, thereby forming at least one contact hole 470, as shown in FIG. 4E. At operation 930, the at least one contact hole 470 is filled with a conductive material 480, as shown in FIG. 4F.

The present disclosure provides a method for manufacturing a semiconductor device, in which the method include a CMP process using a CMP slurry including the abrasive particles bearing negative charges at the slurry pH, the Lewis base and the buffer solution. The CMP process applying the CMP slurry removes the metal oxide layer with the low downward force, resulting in a higher selectivity of the metal oxide layer with respect to the silicon oxide layer and less risk of the scratch damages to the silicon oxide layer. Furthermore, using the CMP slurry having the Lewis base can further increase the removing rate of the metal oxide layer, compared to the CMP slurry without the Lewis base.

In accordance with some embodiments, the present disclosure discloses a method. The method includes providing a substrate on which a silicon oxide layer and a metal oxide layer are formed, in which the silicon oxide layer is covered by the metal oxide layer. The method further includes preparing a chemical mechanical planarization (CMP) slurry. The CMP slurry includes plural abrasive particles bearing negative charges, a Lewis base including a $(X_aY_b)^-$ group, and a buffer solution. The X represents a IIIA group element or an early transitional metal, Y represents a pnictogen element, a chalcogen element or a halogen element, a>0 and b>0. The CMP slurry has a pH in a range substantially from 2 to 7. The method further includes performing a planarization operation on a surface of the metal oxide layer with a polishing head and the CMP slurry injected on the surface of the metal oxide layer until a surface of the silicon oxide layer exposed. The planarization operation has a high polishing selectivity of the metal oxide layer with respect to the silicon oxide layer, and the polishing head applies a downward force to the surface of the metal oxide layer.

In some embodiments of the present disclosure, the metal oxide layer is formed from $HfO_2$, $ZrO_2$ or $Y_2O_3$ and the abrasive particles are formed from $SiO_2$.

In some embodiments of the present disclosure, the abrasive particles further comprise cerium oxide ($CeO_2$), titanium oxide ($TiO_2$), aluminum oxide ($Al_2O_3$), zirconium oxide ($ZrO_2$) or a combination thereof, wherein surfaces of $CeO_2$, $TiO_2$, $Al_2O_3$, and $ZrO_2$ are modified to bear the negative charges in the CMP slurry.

In some embodiments of the present disclosure, applying the CMP slurry is performed using the $(X_aY_b)^-$ group in which a ratio of a to b is substantially in a range from 0.25 to 0.4.

In some embodiments of the present disclosure, applying the CMP slurry is performed using the abrasive particles that are present in an amount of substantially from 0.1 wt. % to 4 wt. % and the Lewis base that is present in an amount of substantially from 0.01 wt. % to 1 wt. %, based on 100 weight percent (wt. %) of the CMP slurry.

In some embodiments of the present disclosure, the selectivity of the planarization operation is substantially greater than 15 between the metal oxide layer and the silicon oxide layer.

In some embodiments of the present disclosure, applying the CMP slurry is performed using the Lewis base comprising $NH_4BF_3$, $HBF_4$, $HBF_3$, $NaBF_3$, $KBCl_3$, $NH_4BCl_3$ or a combination thereof.

In some embodiments of the present disclosure, applying the CMP slurry is performed using the buffer solution comprising phosphoric acid, ammonium hydroxide, an organic acid or a combination thereof, and the organic acid comprises oxalic acid or citric acid.

In some embodiments of the present disclosure, the method further includes forming the silicon oxide layer by a thermal oxidation process or a flowable chemical vapor deposition (FCVD) process, wherein the silicon oxide layer comprises undoped silicate glass (USG), an alkoxysilane compound, thermal oxide, FCVD oxide or a combination thereof.

In some embodiments of the present disclosure, a repulsive force is generated between the abrasive particles and the silicon oxide layer when the silicon oxide layer is exposed during the planarization operation.

In accordance with some embodiments, the present disclosure discloses a method. In the method, a substrate on which an ILD layer is formed is first provided. Then, plural gate structures and plural spacer structures are formed in the ILD layer. The spacer structures peripherally enclose the gate structures respectively. Next, a metal oxide layer is deposited on the gate structures, the spacer structures and the ILD layer, in which the metal oxide layer comprises $HfO_2$, $ZrO_2$ or $Y_2O_3$. Thereafter, a CMP slurry is provided. The CMP slurry includes plural abrasive particles, a Lewis base and a buffer solution. The abrasive particles bear negative charges in the CMP slurry. The Lewis base includes a $(X_aY_b)^-$ group, in which X represents a IIIA group element or an early transitional metal, Y represents a pnictogen element, a chalcogen element or a halogen element, a>0 and b>0. The CMP slurry having a pH in a range substantially from 2 to 7. Next, a planarization operation is performed on a surface of the metal oxide layer with a polishing head and the CMP slurry injected on the surface of the metal oxide layer until a surface of the ILD layer exposed, such that a portion of the metal oxide layer is removed and the other portion of the metal oxide layer is used as an etch stop hard mask. The polishing head applies a downward force onto the surface of the metal oxide layer. Then, the ILD layer using the etch stop hard mask to protect the underlying gate structures, thereby forming at least one contact hole. Thereafter, the at least one contact hole is filled with a conductive material.

In some embodiments of the present disclosure, the planarization operation has a high selectivity to the metal oxide layer with respect to the ILD layer, and the selectivity is substantially greater than 15.

In some embodiments of the present disclosure, performing the planarization operation using the polishing head applies the downward force that is in a range of substantially 0.5 psi to 3 psi.

In some embodiments of the present disclosure, depositing the metal oxide layer is performed by an atomic layer deposition process.

In some embodiments of the present disclosure, forming the ILD layer comprises a thermal oxidation process or a flowable chemical vapor deposition (FCVD) process, and the ILD layer comprises undoped silicate glass (USG), an alkoxysilane compound, thermal oxide, FCVD oxide or a combination thereof.

In some embodiments of the present disclosure, the Lewis base comprising $NH_4BF_3$, $HBF_4$, $HBF_3$, $NaBF_3$, $KBCl_3$, $NH_4BCl_3$ or a combination thereof, and the abrasive particles are formed from $SiO_2$.

In accordance with some embodiments, the present disclosure discloses a method. In the method, a substrate is first provided. Then, two dummy gate stacks are formed on the substrate. Next, a spacer structure is formed on a sidewall of each of the dummy gate stacks. Thereafter, an inter-layer dielectric (ILD) layer is formed on the substrate and between the dummy gate stacks. Next, the dummy gate stacks are removed, thereby forming trenches in the ILD layer. A sidewall of each of the dummy gate stacks is formed in a portion of each of the trenches, in which a top surface of the gate structure is lower than the top surface of the spacer structure. A metal oxide layer is deposited on the gate structure in each of the trenches, the spacer structure and the ILD layer. The metal oxide layer includes $HfO_2$, $ZrO_2$ or $Y_2O_3$. Then, a CMP slurry is prepared. The CMP slurry includes plural $SiO_2$ particles bearing negative charges, a Lewis base and a buffer solution. The Lewis base includes $NH_4BF_3$, $HBF_4$, $HBF_3$, $NaBF_3$, $KBCl_3$, $NH_4BCl_3$ or a combination thereof. The buffer solution includes phosphoric acid, ammonium hydroxide, an organic acid or a combination thereof. The CMP slurry has a pH in a range substantially from 2 to 7. Then, a planarization operation is performed on a surface of the metal oxide layer using a polishing head with a CMP slurry injected onto the surface of the metal oxide layer until the ILD layer exposed, such that a portion of the metal oxide is removed and the other portion of the metal oxide layer is used as an etch stop hard mask. The polishing head applies a downward force onto the surface of the metal oxide layer. Next, the ILD layer is etched using the etch stop hard mask to protect the underlying spacer structure and the gate structure, thereby forming at least one contact hole. Next, the at least one contact hole is filled with a conductive material.

In some embodiments of the present disclosure, forming the spacer structure includes depositing an oxide spacer layer on a sidewall of each of the dummy gate stacks and depositing a nitride spacer layer on the oxide spacer layer and over the sidewall of each of the dummy gate stacks.

In some embodiments of the present disclosure, between removing the dummy gate stacks and forming the gate structure, the method further comprises removing a portion of the oxide spacer layer for forming the oxide spacer layer having a top surface lower than a top surface of the nitride spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate on which a gate structure, an inter-layer dielectric (ILD) layer, and a metal oxide layer are formed, wherein the each of the gate structure and the ILD layer is covered by the metal oxide layer;
   applying a slurry, wherein the slurry comprises a Lewis base; and
   performing a planarization operation on the metal oxide layer with a polishing head and the slurry until the ILD layer is exposed while a top surface of the gate structure remains covered by the metal oxide layer, wherein the planarization operation removes the metal oxide layer at a greater removal rate than the ILD layer, and the polishing head applies a downward force to the metal oxide layer.

2. The method of claim 1, wherein the metal oxide layer is formed from $HfO_2$, $ZrO_2$, or $Y_2O_3$.

3. The method of claim 2, wherein the slurry comprises a plurality of abrasive particles bearing negative charges, the abrasive particles comprise silicon dioxide ($SiO_2$), cerium oxide (CeO$_2$), titanium oxide (TiO$_2$), aluminum oxide (Al$_2$O$_3$), zirconium oxide (ZrO$_2$), or a combination thereof, wherein surfaces of SiO$_2$, CeO$_2$, TiO$_2$, Al$_2$O$_3$, and ZrO$_2$ are modified to bear the negative charges in the slurry.

4. The method of claim 1, wherein: the Lewis base comprises a (X$_a$Y$_b$)$^-$ group; X represents a IIIA group element or an early transitional metal; Y represents a pnictogen element, a chalcogen element, or a halogen element; and applying the slurry is performed using the (X$_a$Y$_b$)$^-$ group in which a ratio of a to b is substantially in a range from 0.25 to 0.4.

5. The method of claim 1, wherein the polishing head applies the downward force that is in a range substantially from 0.5 psi to 3 psi.

6. The method of claim 1, wherein applying the slurry is performed using abrasive particles that are present in an amount of substantially from 0.1 wt. % to 4 wt. % and the Lewis base that is present in an amount of substantially from 0.01 wt. % to 1 wt. %, based on 100 weight percent (wt. %) of the slurry.

7. The method of claim 1, wherein a selectivity of the planarization operation is substantially greater than 15 between the metal oxide layer and the ILD layer.

8. The method of claim 1, wherein applying the slurry is performed using the Lewis base comprising NH$_4$BF$_3$, HBF$_4$, HBF$_3$, NaBF$_3$, KBCl$_3$, NH$_4$BCl$_3$, or a combination thereof.

9. The method of claim 1, wherein applying the slurry is performed using a buffer solution for adjusting a pH of the slurry, the buffer solution comprising phosphoric acid, ammonium hydroxide, an organic acid, or a combination thereof, and the organic acid comprises oxalic acid or citric acid.

10. The method of claim 1, further comprising forming the ILD layer by a thermal oxidation process or a flowable chemical vapor deposition (FCVD) process, wherein the ILD layer comprises undoped silicate glass (USG), an alkoxysilane compound, thermal oxide, FCVD oxide, or a combination thereof.

11. The method of claim 1, wherein a repulsive force is generated between abrasive particles of the slurry and the ILD layer when the ILD layer is exposed during the planarization operation.

12. A method, comprising:
providing a substrate on which an inter-layer dielectric (ILD) layer is formed;
forming a plurality of gate structures and a plurality of spacer structures in the ILD layer, wherein the spacer structures peripherally enclose the gate structures respectively;
depositing a metal oxide layer on the gate structures, the spacer structures and the ILD layer;
applying a slurry, wherein the slurry comprises
a Lewis base; and
performing a planarization operation on the metal oxide layer with a polishing head and the slurry until the ILD layer is exposed, such that a portion of the metal oxide layer is removed and such that another portion of the metal oxide layer is used as an etch stop hard mask on a top surface of at least one of the gate structures, wherein the polishing head applies a downward force onto the metal oxide layer;
etching the ILD layer using the etch stop hard mask to protect the underlying gate structures, thereby forming at least one contact hole; and
filling the at least one contact hole with a conductive material.

13. The method of claim 12, wherein the planarization operation has a high selectivity to the metal oxide layer with respect to the ILD layer, and the selectivity is substantially greater than 15.

14. The method of claim 12, wherein the polishing head applies the downward force that is in a range of substantially 0.5 psi to 3 psi.

15. The method of claim 12, wherein depositing the metal oxide layer is performed by an atomic layer deposition process.

16. The method of claim 12, wherein forming the ILD layer comprises a thermal oxidation process or a flowable chemical vapor deposition (FCVD) process, and the ILD layer comprises undoped silicate glass (USG), an alkoxysilane compound, thermal oxide, FCVD oxide, or a combination thereof.

17. The method of claim 12, wherein the Lewis base comprises NH$_4$BF$_3$, HBF$_4$, HBF$_3$, NaBF$_3$, KBCl$_3$, NH$_4$BCl$_3$, or a combination thereof, and the slurry comprises abrasive particles formed from SiO$_2$.

18. A method, comprising:
providing a substrate;
forming two dummy gate stacks on the substrate;
forming a spacer structure on a sidewall of each of the dummy gate stacks;
forming an inter-layer dielectric (ILD) layer on the substrate and between the dummy gate stacks;
removing the dummy gate stacks to form trenches in the ILD layer;
forming a gate structure in a portion of each of the trenches, wherein a top surface of the gate structure is lower than the top surface of the spacer structure;
depositing a metal oxide layer on the gate structure in each of the trenches, the spacer structure, and the ILD layer, wherein the metal oxide layer comprises HfO$_2$, ZrO$_2$, or Y$_2$O$_3$;
preparing a CMP slurry, the CMP slurry comprising:
a plurality of SiO$_2$ particles bearing negative charges;
a Lewis base comprising: NH$_4$BF$_3$, HBF$_4$, HBF$_3$, NaBF$_3$, KBCl$_3$, NH$_4$BCl$_3$, or a combination thereof; and
a buffer solution comprising: phosphoric acid, ammonium hydroxide, an organic acid, or a combination thereof, the CMP slurry having a pH in a range substantially from 2 to 7;
performing a planarization operation on a surface of the metal oxide layer using a polishing head with the CMP slurry injected onto the surface of the metal oxide layer until the ILD layer is exposed, such that a portion of the metal oxide layer is removed and another portion of the metal oxide layer is used as an etch stop hard mask, wherein the polishing head applies a downward force to the metal oxide layer;
etching the ILD layer using the etch stop hard mask to protect the underlying spacer structure and the gate structure, thereby forming at least one contact hole; and
filling the at least one contact hole with a conductive material.

19. The method of claim 18, wherein forming the spacer structure comprises:
depositing an oxide spacer layer on the sidewall of each of the dummy gate stacks; and
depositing a nitride spacer layer on the oxide spacer layer and over the sidewall of each of the dummy gate stacks.

20. The method of claim 19, wherein between removing the dummy gate stacks and forming the gate structure, the method further comprises removing a portion of the oxide spacer layer for forming the oxide spacer layer having a top surface lower than a top surface of the nitride spacer layer.

* * * * *